United States Patent [19]

Levinstein et al.

[11] 4,011,583
[45] Mar. 8, 1977

[54] OHMICS CONTACTS OF GERMANIUM AND PALLADIUM ALLOY FROM GROUP III–V N-TYPE SEMICONDUCTORS

[75] Inventors: Hyman Joseph Levinstein, Berkeley Heights; Ashok Kumar Sinha, Murray Hill, both of N.J.

[73] Assignee: Bell Telephone Laboratories, Incorporated, Murray Hill, N.J.

[22] Filed: May 27, 1976

[21] Appl. No.: 690,400

Related U.S. Application Data

[62] Division of Ser. No. 502,451, Sept. 3, 1974, Pat. No. 3,965,279.

[52] U.S. Cl. .................................. 357/67; 357/65; 357/71; 29/589; 427/82
[51] Int. Cl.² ................. H01L 23/48; H01L 29/46; H01L 29/62; H01L 29/64
[58] Field of Search ........... 357/65, 67, 71; 29/589; 427/82

[56] References Cited

UNITED STATES PATENTS

| 3,186,084 | 6/1965 | Betteridge | 357/67 |
| 3,386,867 | 6/1968 | Staples | 357/67 |
| 3,532,562 | 10/1970 | Clawson et al. | 357/67 |
| 3,711,745 | 1/1973 | Moroney | 357/67 |
| 3,889,286 | 6/1975 | Debesis | 357/67 |

*Primary Examiner*—Andrew J. James
*Attorney, Agent, or Firm*—Lester H. Birnbaum

[57] ABSTRACT

A metallization scheme for providing an ohmic contact to n-type III–V semiconductors is described. A metallurgical combination including germanium and palladium is formed on the semiconductor surface either in the form of an alloy or discrete layers. The structure is then heated so that the metallic and semiconductor components interdiffuse to establish the ohmic contact without melting of the metal. One advantage of such a solid state process is the high degree of dimensional control of the contact which is attainable.

6 Claims, 3 Drawing Figures

4,011,583

OHMICS CONTACTS OF GERMANIUM AND PALLADIUM ALLOY FROM GROUP III–V N-TYPE SEMICONDUCTORS

CROSS-REFERENCE TO RELATED APPLICATION

This application is a division of applicants' copending U.S. patent application, Ser. No. 502,451, filed Sept. 3, 1974, now U.S. Pat. No. 3,965,279, allowed Feb. 6, 1976, and assigned to the present assignee.

BACKGROUND OF THE INVENTION

This invention relates generally to ohmic contact metallization on n-type III–V semiconductors, and in particular to contacts formed on semiconductors containing Ga and As.

A great deal of interest has been generated in the formation of devices and integrated circuits which comprise a III–V semiconductor material. Attention has focused primarily on GaAs which is useful in forming FETs, IMPATT diodes and lasers. Such applications usually require reliable, low resistance ohmic contacts to the semiconductor surface. Typically, present contacting schemes involve depositing a gold-germanium eutectic or tin-based alloy metal film on the surface of GaAs and then heating sufficiently to melt the metal and thereby alloy the metal film with the semiconductor. Such processes produce ohmic contacts adequate for most purposes. However, an important disadvantage is inherent in the melting process, namely, the poor dimensional control of the contact metallization. This lack of dimensional control becomes increasingly significant where only small areas are available for contacting. It is therefore desirable to provide a metallization and process which results in ohmic contacts with well-defined dimensions.

SUMMARY OF THE INVENTION

This and other objects are achieved in accordance with the invention which utilizes a metallization scheme including germanium and palladium. The metal film is formed on the semiconductor in discrete layers or as an alloy. The film is then heated to a temperature sufficient to interdiffuse the metallic and semiconductor components to form the ohmic contact, but which temperature is insufficient to melt the metal. In a particular embodiment, successive layers of Ge and Pd were deposited on a surface of a GaAs semiconductor and heated in the range 350°–500° C to achieve a contact of ohmic characteristics without any evidence of melting and, accordingly, with good dimensional control.

BRIEF DESCRIPTION OF THE DRAWING

These and other features of the invention are delineated in detail in the description to follow. In the drawing.

It will be appreciated that for purposes of illustration these figures are not necessarily drawn to scale.

DETAILED DESCRIPTION OF THE INVENTION

Figure 1A:
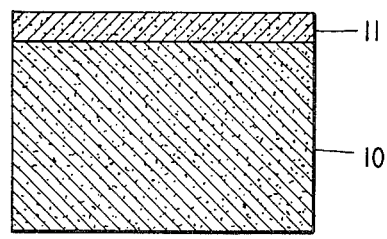
FIGS. 1A–1C are cross-sectional views of a device during various stages of manufacture in accordance with one embodiment of the invention.
Figure 1B:
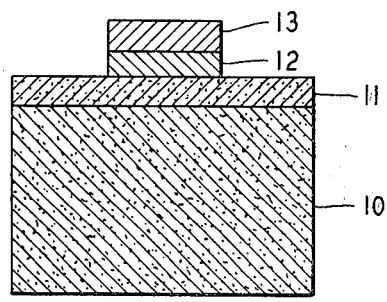
Figure 1C:
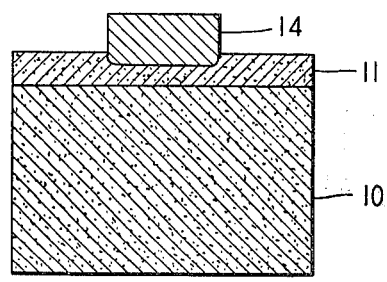

One embodiment of the invention is illustrated in the sequence of events shown in FIGS. 1A–1C. The starting material, as shown in FIG. 1A, comprised a substrate, 10, of n+ type GaAs doped with Te or Si to a concentration of approximately $1.5 \times 10^{18}$ cm$^{-3}$. Formed on one surface of the substrate by vapor phase epitaxy was a layer, 11, of n-type GaAs doped with sulfur to a concentration of approximately $10^{16}$ cm$^{-3}$. It should be realized, of course, that this sample is only illustrative of the types of structures which may utilize the contacts in accordance with the present invention.

Thin films of germanium, 12, and palladium, 13, each approximately 500 A in thickness, were then sequentially deposited on the epitaxial surface of the structure as illustrated in FIG. 1B. The particular means employed for deposition was electron beam vacuum evaporation, but other standard deposition techniques known in the art, such as sputtering, may also be employed. A preferred range of thickness for the germanium layer appeared to be 100 – 1,000 A to allow the palladium layer to diffuse through to the substrate. The palladium layer can be made thicker, with a preferred range of 300 A – 1μ. The shape of the metal film was defined by using standard photolithographic techniques. That is, the film was deposited over the entire surface, covered by a photoresist, and the photoresist exposed through a mask, followed by developing the photoresist and etching in turn the metals in the areas not protected by the photoresist. The Pd layer was etched in a solution comprising 0.75 gm of $K_2Cr_2O_7$, 75 ml of $H_3PO_4$, 25 ml of $H_2O$, and 5 ml of HCl. The Ge was etched in a solution comprising 45 ml of $HNO_3$, 27 ml of $CH_3COOH$ and 28 ml of HF.

The sample was then sintered in vacuum at a temperature of approximately 500° C until the contact exhibited good ohmic behavior, which in this case was a period of approximately 2 hours. The resulting structure is illustrated in FIG. 1C. X-ray diffraction studies of contact 14 revealed the presence of PdGe, PdGa and PdAs$_2$ without any evidence of unreacted Pd, although it is expected that Pd-rich compounds such as Pd$_2$Ge or Pd$_2$Ga might be formed if excess Pd were present in the system. Microstructural examination of the structure revealed no evidence of melting of the film as a result of the heat treatment. Further, the physical dimensions of the contact area remained well-defined.

The above results point out one of the differences as well as one of the advantages of the present process over the prior art contacting method. That is, since the metal film is sintered and not melted, good control of the shape of the contact is possible. In the context of this application, "sintering" is the interdiffusion of the metal components into the semiconductor and the semiconductor components into the metal so as to form a coherent mass without melting.

It is significant to note that neither germanium alone nor palladium alone will form ohmic contacts to n-type GaAs, as will the combination. Nor does it appear that good ohmic contacts can be formed on p-type material with this combination. Furthermore, it appears that Ge should be deposited first on the semiconductor surface. It is therefore theorized that the doping of GaAs by Ge, with the Ge acting as a donor, is apparently necessary for ohmic contact while the Pd is apparently necessary to accelerate the diffusion of Ge into GaAs by a sweeping action and also to take part in a charge exchange process to make Ge a donor. This theory is offered as a possible explanation of the mechanism of the process and should not be thought of as a limitation of the inventive method.

Electrical data were obtained for the sample with surface doping concentration of $1.5 \times 10^{18}$ cm$^{-3}$ treated as described above, as well as n-type samples with doping concentrations of $1.2 \times 10^{16}$ and $1 \times 10^{17}$ which were identically treated. It was noted that the contact resistance was a function of doping concentration with contact resistances of $3.5 \times 10^{-5}$ ohm-cm$^2$, $1.7 \times 10^{-4}$ ohm-cm$^2$ and $3 \times 10^{-4}$ ohm-cm$^2$ found for samples with surface doping concentrations of $1.5 \times 10^{18}$ cm$^{-3}$, $1 \times 10^{17}$ cm$^{-3}$ and $1.2 \times 10^{16}$ cm$^{-3}$, respectively. Consistent with these findings, it was shown that less severe heat treatments were required to achieve good ohmic contacts for higher doped samples. For example, on a sample with doping concentration of approximately $10^{16}$ cm$^{-3}$, a sintering at 500° C for approximately two hours was generally desirable for good ohmic contacts, while a treatment at 350° C for 15 minutes was sufficient to produce good ohmic contacts on samples with a surface concentration of approximately $2 \times 10^{18}$ cm$^{-3}$. In this regard, it is generally understood in the art that a "good" ohmic contact is one which exhibits an approximately linear I–V characteristic up to 10 milliamps. In general, the contact resistivity should be less than $10^{-3}$ ohm-cm$^2$ to be adequate for most applications.

On the basis of these and other experiments, it is suggested that the sintering should advantageously be done in the temperature range 200°–700° C for 5 min. – 24 hours. Less severe heat treatments will not result in good ohmic contacts, while more severe treatments could lead to some melting. It is believed that the optimum heat treatment is 300°–550° C for 10 min. – 3 hours, which treatment as described above produces ohmic contacts comparable in electrical properties to prior art alloying techniques while maintaining good dimensional control.

The inventive method has been described in terms of forming an ohmic contact on an n-type GaAs semiconductor. It should be clear on the basis of the mechanism of the reaction that other semiconductors which include Ga and As, such as GaAsP and GaAlAs, would also benefit from the described process. It should also be anticipated that the Ge and Pd metals could be deposited on the semiconductor as an alloy, rather than as discrete layers. In a typical embodiment, the alloy could comprise approximately equal amounts of Ge and Pd. After deposition of the alloy on the surface by standard techniques, the sintering step as previously described could be practiced to achieve an ohmic contact.

It should be also noted that while the heating step is preferably performed in vacuum, this step may also be carried out in other inert atmospheres such as nitrogen or argon, as well as in air.

Various additional modifications will become apparent to those skilled in the art. All such variations which basically rely on the teachings through which the invention had advanced the art are properly considered within the spirit and scope of the invention.

What is claimed is:

1. A semiconductor device comprising a body of semiconductor material of n conductivity type comprising a group III element and group V element and an ohmic contact formed on one surface of said body wherein said contact comprises a combination of Pd-Ge compounds, Pd-group III element compounds and Pd-group V element compounds.

2. The device according to claim 1 wherein the semiconductor material comprises Ga and As.

3. The device according to claim 2 wherein the contact comprises a combination of Pd-Ge compounds, Pd-Ga compounds and PdAs$_2$.

4. A semiconductor device comprising a body of III–V semiconductor material of n conductivity type and an ohmic contact formed on one surface of said body wherein said contact comprises a combination of Pd-Ge compounds, Pd-Ga compounds and PdAs$_2$.

5. The device according to claim 4 wherein the semiconductor material comprises Ga and As.

6. The device according to claim 4 wherein the semiconductor material consists essentially of GaAs.

* * * * *

UNITED STATES PATENT AND TRADEMARK OFFICE
CERTIFICATE OF CORRECTION

PATENT NO. : 4,011,583
DATED : March 8, 1977
INVENTOR(S) : Hyman J. Levinstein and Ashok K. Sinha It is certified that error appears in the above-identified patent and that said Letters Patent are hereby corrected as shown below:

Change title to read: --Ohmic Contacts of Germanium and Palladium Alloy for Group III-V N-Type Semiconductors--.

Signed and Sealed this

Twenty-seventh Day of September 1977

[SEAL]

Attest:

RUTH C. MASON
*Attesting Officer*

LUTRELLE F. PARKER
*Acting Commissioner of Patents and Trademarks*